(12) United States Patent
Cheng et al.

(10) Patent No.: US 10,396,172 B2
(45) Date of Patent: Aug. 27, 2019

(54) TRANSISTOR WITH AIR SPACER AND SELF-ALIGNED CONTACT

(71) Applicant: International Business Machines Corporation, Armonk, NY (US)

(72) Inventors: Kangguo Cheng, Schenectady, NY (US); Xin Miao, Guilderland, NY (US); Peng Xu, Guilderland, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 278 days.

(21) Appl. No.: 15/431,944

(22) Filed: Feb. 14, 2017

(65) Prior Publication Data

US 2018/0090586 A1 Mar. 29, 2018

Related U.S. Application Data

(62) Division of application No. 15/276,985, filed on Sep. 27, 2016, now Pat. No. 9,721,897.

(51) Int. Cl.
*H01L 29/66* (2006.01)
*H01L 29/40* (2006.01)
(Continued)

(52) U.S. Cl.
CPC .... *H01L 29/4991* (2013.01); *H01L 21/02126* (2013.01); *H01L 21/28247* (2013.01); *H01L 21/30604* (2013.01); *H01L 21/31111* (2013.01); *H01L 21/7682* (2013.01); *H01L 21/76897* (2013.01); *H01L 23/535* (2013.01); *H01L 29/0649* (2013.01); *H01L 29/401* (2013.01); *H01L 29/41775* (2013.01); *H01L 29/6653* (2013.01); *H01L 29/6656* (2013.01);
(Continued)

(58) Field of Classification Search
CPC .................................................. H01L 29/4991
See application file for complete search history.

(56) References Cited

U.S. PATENT DOCUMENTS 6,180,988 B1   1/2001   Wu
7,132,342 B1   11/2006  Sadovnikov et al.
(Continued)

OTHER PUBLICATIONS

List of IBM Patents or Patent Applications Treated as Related; (Appendix P), Filed Feb. 14, 2017; 2 pages.
(Continued)

*Primary Examiner* — Moazzam Hossain
(74) *Attorney, Agent, or Firm* — Cantor Colburn LLP; Vazken Alexanian

(57) ABSTRACT

A method of fabricating a semiconductor transistor and the semiconductor transistor include a source region and a drain region within a substrate. The method includes forming a gate above the substrate, forming a source contact above the source region and a drain contact above the drain region, and forming air spacers within a dielectric between the gate and each of the source contact and the drain contact. Metal caps are formed on the source contact and the drain contact, and a gate cap is formed between the dielectric and at least a portion of a bottom surface of higher-level contacts, which are contacts formed above the source contact and the drain contact.

15 Claims, 11 Drawing Sheets

(51) Int. Cl.
*H01L 29/49* (2006.01)
*H01L 21/02* (2006.01)
*H01L 21/311* (2006.01)
*H01L 21/768* (2006.01)
*H01L 23/535* (2006.01)
*H01L 29/06* (2006.01)
*H01L 21/306* (2006.01)
*H01L 21/28* (2006.01)
*H01L 29/417* (2006.01)

(52) U.S. Cl.
CPC .. *H01L 29/66553* (2013.01); *H01L 21/76849* (2013.01); *H01L 29/66545* (2013.01)

(56) References Cited

U.S. PATENT DOCUMENTS

| | | |
|---|---|---|
| 7,741,663 B2 | 6/2010 | Hause et al. |
| 8,304,906 B2 | 11/2012 | Huang et al. |
| 8,390,079 B2 | 3/2013 | Horak et al. |
| 8,637,384 B2 | 1/2014 | Ando et al. |
| 8,922,018 B2 | 12/2014 | Ishizaki et al. |
| 9,305,835 B2 | 4/2016 | Alptekin et al. |
| 2009/0321853 A1* | 12/2009 | Cheng .............. H01L 29/42368 257/410 |
| 2010/0032796 A1* | 2/2010 | Brown .............. H01L 21/76289 257/510 |
| 2011/0309416 A1 | 12/2011 | Yamashita et al. |
| 2013/0049132 A1* | 2/2013 | Doris ................. H01L 21/7682 257/383 |
| 2015/0091089 A1* | 4/2015 | Niebojewski ....... H01L 29/0843 257/347 |
| 2015/0263122 A1* | 9/2015 | Hsiao .................... H01L 29/515 257/401 |
| 2015/0372102 A1* | 12/2015 | Usami .............. H01L 29/41775 257/327 |
| 2017/0125530 A1* | 5/2017 | Zhang .............. H01L 29/41791 |
| 2017/0207118 A1* | 7/2017 | Peng .................. H01L 29/0847 |

OTHER PUBLICATIONS

Kangguo Cheng et al., "Transistor With Air Spacer and Self-Aligned Contact", U.S. Appl. No. 15/276,985, filed Sep. 27, 2016.
List of IBM Patents or Patent Applications Treated as Related; (Appendix P), Filed Apr. 13, 2017; 2 pages.
Kangguo Cheng et al., "Transistor With Air Spacer and Self-Aligned Contact", U.S. Appl. No. 15/485,886, filed Apr. 12, 2017.
Park et al., "Air Spacer MOSFET Technology for 20nm Node and Beyond", 9th International Conference on Solid-State and Integrated-Circuit Technology, ICSICT, 2008, pp. 53-56.

* cited by examiner

US 10,396,172 B2

TRANSISTOR WITH AIR SPACER AND SELF-ALIGNED CONTACT

This application is a division of U.S. application Ser. No. 15/276,985 filed Sep. 27, 2016, issued as U.S. Pat. No. 9,721,897 on Aug. 1, 2017, the disclosure of which is incorporated herein by reference in its entirety.

BACKGROUND

The present invention relates to semiconductor transistors, and more specifically, to transistors with air spacers and self-aligned contacts.

Semiconductor transistors have gate, source, and drain terminals and are typically used as switches and amplifiers in integrated circuit for a number of applications. A conducting channel is formed between the source and drain regions below the gate. Insulation is needed between the gate and source or drain contacts, which are all conductors. In addition, higher-level contacts must self-align with lower level contacts to prevent failure of the transistor.

SUMMARY

According to an embodiment of the present invention, a method of fabricating a semiconductor transistor includes forming a source region and a drain region within a substrate, forming a gate above the substrate, and forming a source contact above the source region and a drain contact above the drain region. Air spacers are formed within a dielectric between the gate and each of the source contact and the drain contact. Metal caps are formed on the source contact and the drain contact, and a gate cap is formed between the dielectric and at least a portion of a bottom surface of higher-level contacts, which are contacts formed above the source contact and the drain contact.

According to another embodiment, a semiconductor transistor includes a source region and a drain region formed within a substrate, a gate formed above the substrate, and a source contact formed above the source region and a drain contact formed above the drain contact. The transistor also includes air spacers formed within a dielectric between the gate and each of the source contact and the drain contact. Metal caps are formed on the source contact and the drain contact, and a gate cap is formed between the dielectric and at least a portion of a bottom surface of higher-level contacts, which are contacts formed above the source contact and the drain contact.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-11 are cross-sectional views that show formation of higher-level contacts according to one or more embodiments, in which:

FIG. 1 is a cross-sectional view of an intermediate structure prior to any air spacer or contact formation;

FIG. 2 shows the result of recessing the gate shown in FIG. 1 according to an embodiment;

FIG. 3 shows the intermediate structure that results from forming a sacrificial dielectric cap on the gate metal;

FIG. 4 shows the cross-sectional view that results in formation of the source and drain contacts;

FIG. 5 shows the result of removing the sacrificial dielectric cap and sacrificial spacers from the intermediate structure shown in FIG. 4;

FIG. 6 shows the intermediate structure that includes the air spacer;

FIG. 7 shows the formation of selective metal caps on the source and drain contacts;

FIG. 8 shows an additional gate cap that is deposited conformally on the structure shown in FIG. 7;

FIG. 9 shows the result of planarizing the additional gate cap;

FIG. 10 shows the result of patterning trenches for higher-level contacts above the selective metal caps; and FIG. 11 shows the higher-level contacts that are formed by depositing metal into the trenches shown in FIG. 10.

DETAILED DESCRIPTION

As previously noted, an insulating spacer is needed between the gate and source and drain contacts of a transistor. In addition, higher level contacts must be self-aligned with the lower level contacts in order to prevent the contact metal from causing a failure of the transistor. When a solid insulating material is used between the gate and source and drain contacts, an undesirable parasitic capacitance can form. Thus, a prior approach has involved using an air gap as a spacer between the gate and source/drain contacts. However, the air spacer and self-aligned contact can work against each other. This is because, while the air gap between the gate and contacts is desirable, the formation of the air gap results in a seam above the gate. This seam can become an undesired opening during formation of the self-aligned contact and thereby trap metal in the air spacer during formation of the higher level contact.

Turning now to an overview, one or more embodiments relate to forming a void-free dielectric cap around metal caps above the source and drain contacts. This additional gate cap, which is additional to the dielectric cap used in the formation of the source and drain contacts, prevents the seam in the air gap from becoming an undesired opening during formation of the self-aligned contact. As a result, the additional gate cap ensures that metal in higher level contacts is completely isolated from the air gap insulation.

Figure 1:
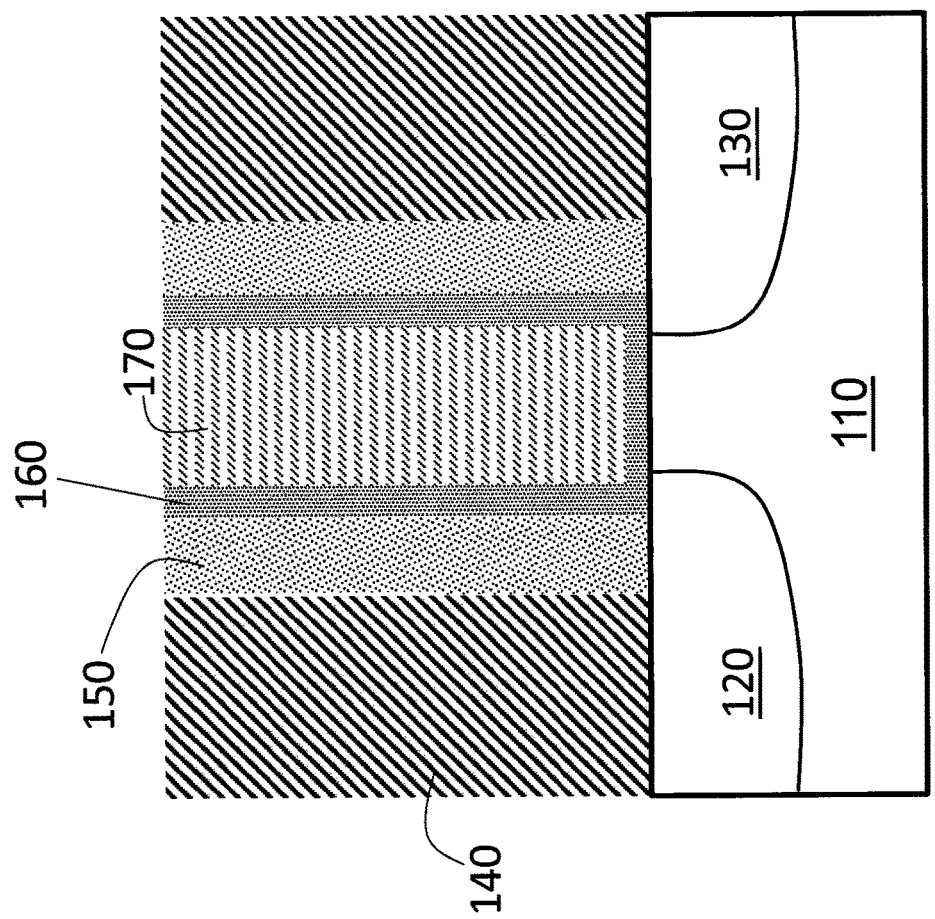

Turning now to a more detailed description of one or more embodiments, FIGS. 1-11 show cross-sectional views of intermediate structures involved in the formation of higher-level contacts 1110 (FIG. 11) in a metal-oxide-semiconductor field-effect transistor (MOSFET) fabricated via complementary metal-oxide semiconductor (CMOS) technology. FIG. 1 is a cross-sectional view of an intermediate structure prior to any air spacer or contact formation. Source 120 and drain 130 regions are formed within a substrate 110. A gate 170 is formed above the substrate 110 and is lined by a gate dielectric 160. Sacrificial spacers 150 are formed adjacent to the gate dielectric 160, as shown. According to some embodiments (not shown), the gate spacers 150 are adjacent to the gate 170, because the gate dielectric 160 presents only between the gate 170 and the substrate 110 but not on the sidewalls of the gate 170. The source 120 and drain 130 regions are doped with n-type dopants or p-type dopants.

According to one or more embodiments, the top surfaces of the source 120 and drain 130 regions can be coplanar with the bottom of the gate dielectric 160, as shown. In alternate embodiments, the top surfaces of the source 120 and drain 130 regions can be above or below the bottom of the gate dielectric 160. Although a planar MOSFET is shown, other MOSFET devices such as, for example, finFETs, nanowire transistors, nanosheet transistors, vertical transistors, bipolar junction transistors (BJT), or any suitable combination of those devices, can also be fabricated according to the one or more embodiments described herein.

The sacrificial spacers 150 can be silicon nitride (SiN) spacers, for example. An inter-layer dielectric (ILD) 140 is formed adjacent to each sacrificial spacer 150. The ILD 140 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (Si-COH), or any suitable combination of those materials.

The gate dielectric 160 can include, for example, silicon oxide, silicon nitride, silicon oxynitride, boron nitride, high-k materials, or any combination of these materials. Exemplary high-k materials include, for example, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum or aluminum.

The gate 170 can include any conducting material such as, for example, doped polycrystalline or amorphous silicon, germanium, silicon germanium, a metal (e.g., tungsten, titanium, tantalum, ruthenium, zirconium, cobalt, copper, aluminum, lead, platinum, tin, silver, and gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, and nickel silicide), carbon nanotubes, conductive carbon, graphene, or any suitable combination of these materials. The conductive material can further comprise dopants that are incorporated during or after deposition. The gate 170 can further comprise a gate work function setting layer (not shown) between the gate dielectric 160 and the gate conductor. The gate work function setting layer can be a metallic compound such as, for example, (i) nitrides (e.g., titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), and niobium nitride (NbN)); (ii) carbides (e.g., titanium carbide (TiC), titanium aluminum carbide (TiAlC), tantalum carbide (TaC), and hafnium carbide (HfC)); and (iii) combinations thereof. Processes for forming gate dielectric and gate conductors include, but are not limited to, atomic layer deposition (ALD), molecular layer deposition (MLD), chemical vapor deposition (CVD), physical vapor deposition, sputtering, plating, evaporation, ion beam deposition, electron beam deposition, laser assisted deposition, chemical solution deposition, or any combination of those methods.

The substrate 110 can include a bulk semiconductor, such as silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates 110 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 110 can also comprise an organic semiconductor or a layered semiconductor such as, for example, Si/SiGe, a silicon-on-insulator or a SiGe-on-insulator. A portion or entire semiconductor substrate 110 can be amorphous, polycrystalline, or monocrystalline. In addition to the aforementioned types of semiconductor substrates 110, the semiconductor substrate 110 can also comprise a hybrid oriented (HOT) semiconductor substrate in which the HOT substrate has surface regions of different crystallographic orientation. The semiconductor substrate 110 can be doped, undoped, or contain doped regions and undoped regions therein. The semiconductor substrate 110 can contain regions with strain and regions without strain therein, or contain regions of tensile strain and compressive strain. In one or more embodiments, the substrate 110 can be a semiconductor-on-insulator (SOI) substrate. The substrate 110 can further include other structures (not shown) such as shallow trench isolation (STI), fins, nanowires, nanosheets, resistors, capacitors, etc. The formation of the intermediate structure shown in FIG. 1 is known and not further detailed herein.

Figure 2:
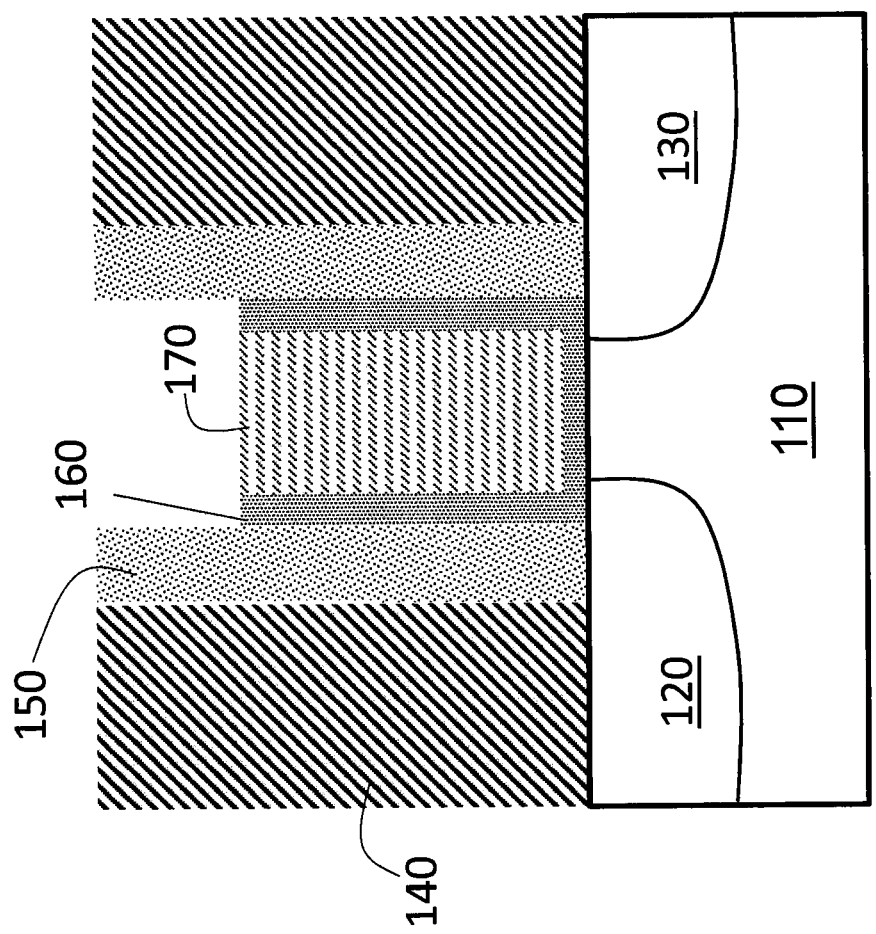

FIG. 2 shows the result of recessing the gate 170 shown in FIG. 1 according to an embodiment. As shown in FIG. 2, the gate dielectric 160 exposed by the recessing of the gate 170 can also be removed. In alternate embodiments, the gate dielectric 160 is retained even in the portions where the gate 170 is recessed. In other embodiments, the gate 170 is recessed while the gate dielectric 160 presents only between the gate 170 and the substrate 110, not on the sidewalls of the gate 170.

Figure 3:
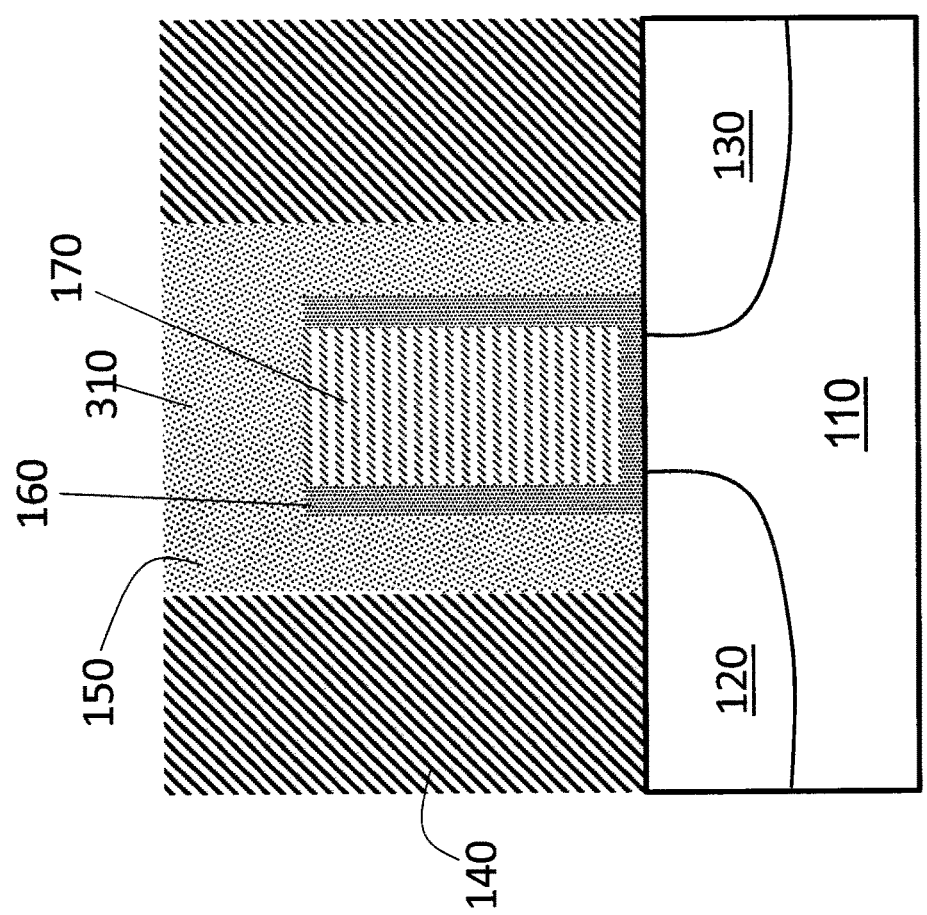

FIG. 3 shows the intermediate structure that results from forming a sacrificial dielectric cap 310 on the gate metal 170. The sacrificial dielectric cap 310 can be a dielectric (e.g., SiN) like the sacrificial spacers 150, as shown in FIG. 3. In alternate embodiments, the sacrificial spacers 150 and sacrificial dielectric cap 310 need not be the same material. The sacrificial dielectric cap 310 is formed by deposition followed by a planarization process (e.g., chemical mechanical planarization (CMP)).

Figure 4:
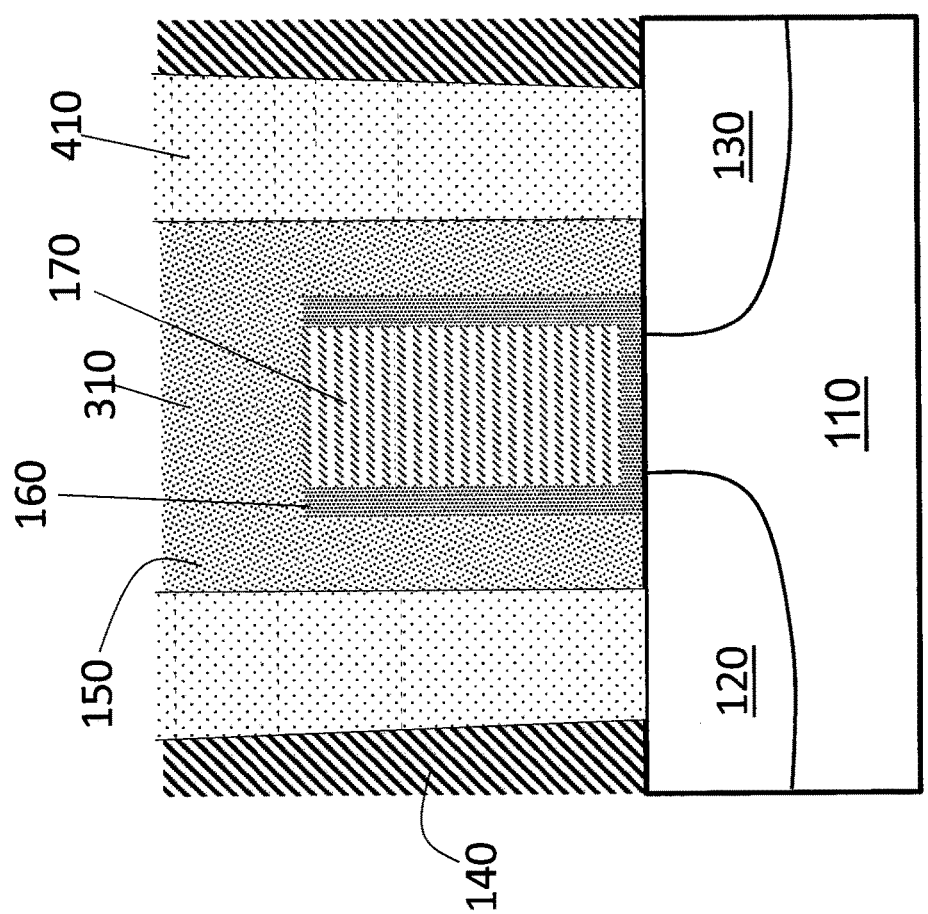

FIG. 4 shows the cross-sectional view that results in formation of the source and drain contacts 410, which are referred to as trench contacts. The ILD 140 is patterned to form trenches above the source 120 and drain 130 regions, and a metal fill is deposited and planarized to form the source and drain contacts 410. According to one or more embodiments, silicide can be formed between the source and drain contacts 410 and the source 120 and drain 130 regions. In alternate embodiments, the source and drain contacts 410 are directly over the source 120 and drain 130 regions. The source and drain contacts 410 can include any suitable conducting material such as metals, conducting metallic compounds. In one or more embodiments, each contact 410 can include a liner (e.g., titanium nitride) on the trench sidewalls and the rest of contact trench is filled with a metal such as tungsten, or cobalt.

Figure 5:
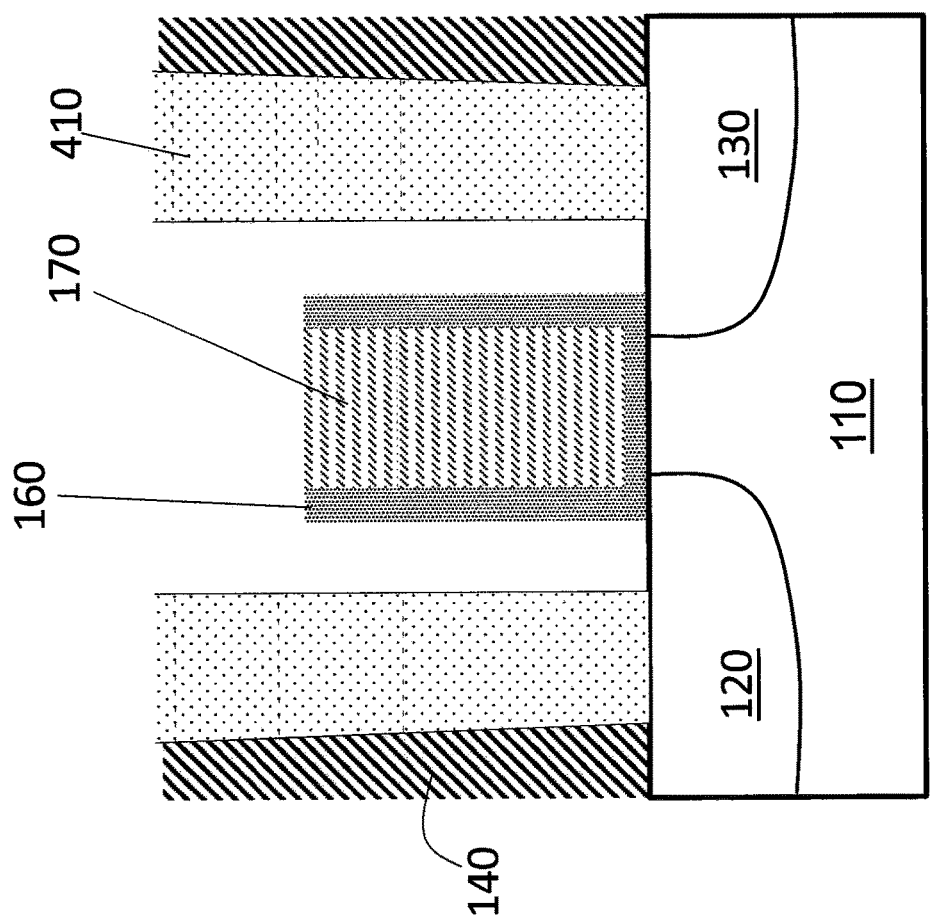

FIG. 5 shows the result of removing the sacrificial dielectric cap 310 and sacrificial spacers 150 from the intermediate structure shown in FIG. 4. The removal is by a plasma etch process when the sacrificial dielectric cap 310 and sacrificial spacers 150 are SiN, for example. Other suitable etch processes, such as a wet etch or dry etch, can be used to remove the sacrificial dielectric cap 310 and the sacrificial spacers 150.

Figure 6:
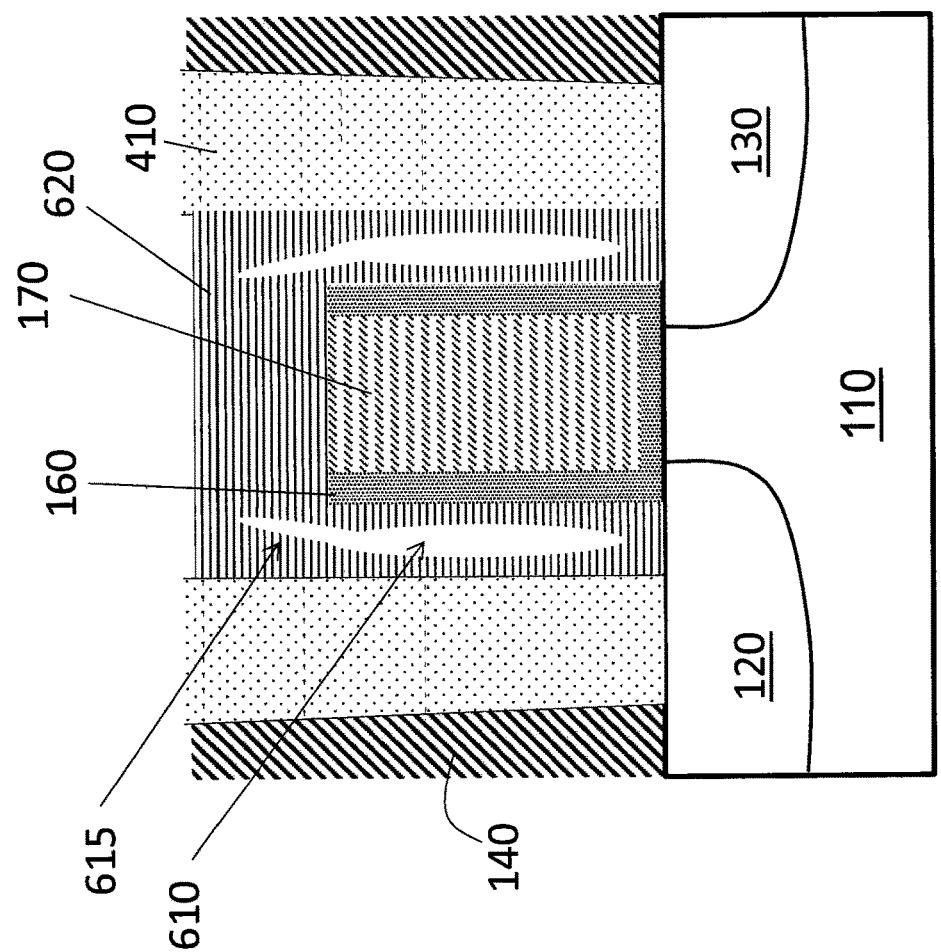

FIG. 6 shows the intermediate structure that includes the air spacer 610. Formation of the air spacer 610 is known and is not further detailed herein. As FIG. 6 indicates, the air spacer 610 is formed in a non-conformal dielectric 620. A seam 615 is formed above the gate 170 as shown. As previously discussed, this seam 615 can present a challenge during formation of the self-aligned higher-level contacts 1110. Specifically, the seam 615 could open during formation of the self-aligned higher-level contacts 1110 such that metal enters the air spacer 610. According to one or more embodiments, this issue is addressed by an additional gate cap 810 (FIG. 8).

Figure 7:
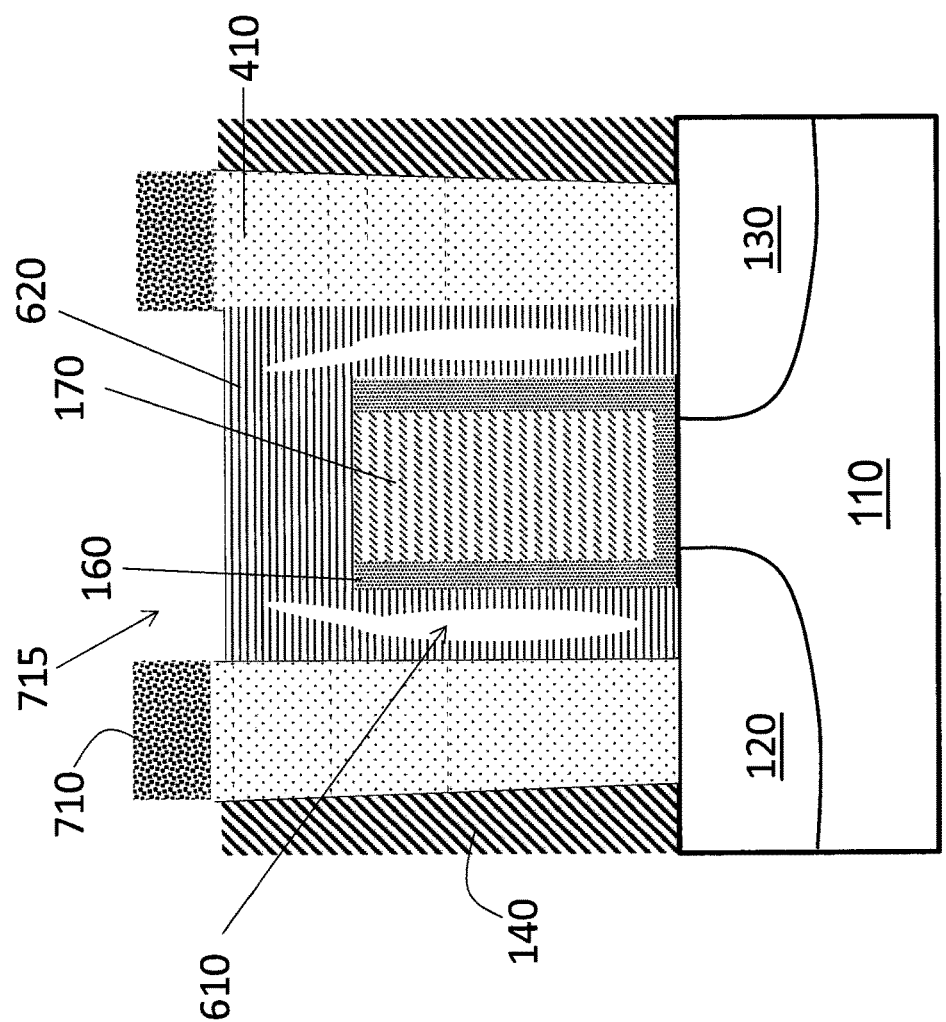

FIG. 7 shows the formation of selective metal caps 710 on the source and drain contacts 410. Any suitable known selective metal deposition can be used for formation of selective metal caps 710 and is not detailed herein. In one or more embodiments, selective metal deposition is performed using selective nucleation on the source and drain contacts 410 to form selective metal caps 710. The selectively deposited metal can be tungsten, cobalt, or ruthenium, for example. The selective metal cap 710 can be deposited using, for example, selective atomic layer deposition (ALD) or selective chemical vapor deposition (CVD) that inhibits the nucleation of the metal on surfaces other than the source and drain contacts 410. As FIG. 7 indicates, the selective metal caps 710 are only formed on the source and drain contacts 410 but not on the non-conformal dielectric 620. As FIG. 7 also indicates, there is a gap 715 between the selective metal caps 710 that are formed on the source and drain contacts 410.

Figure 8:
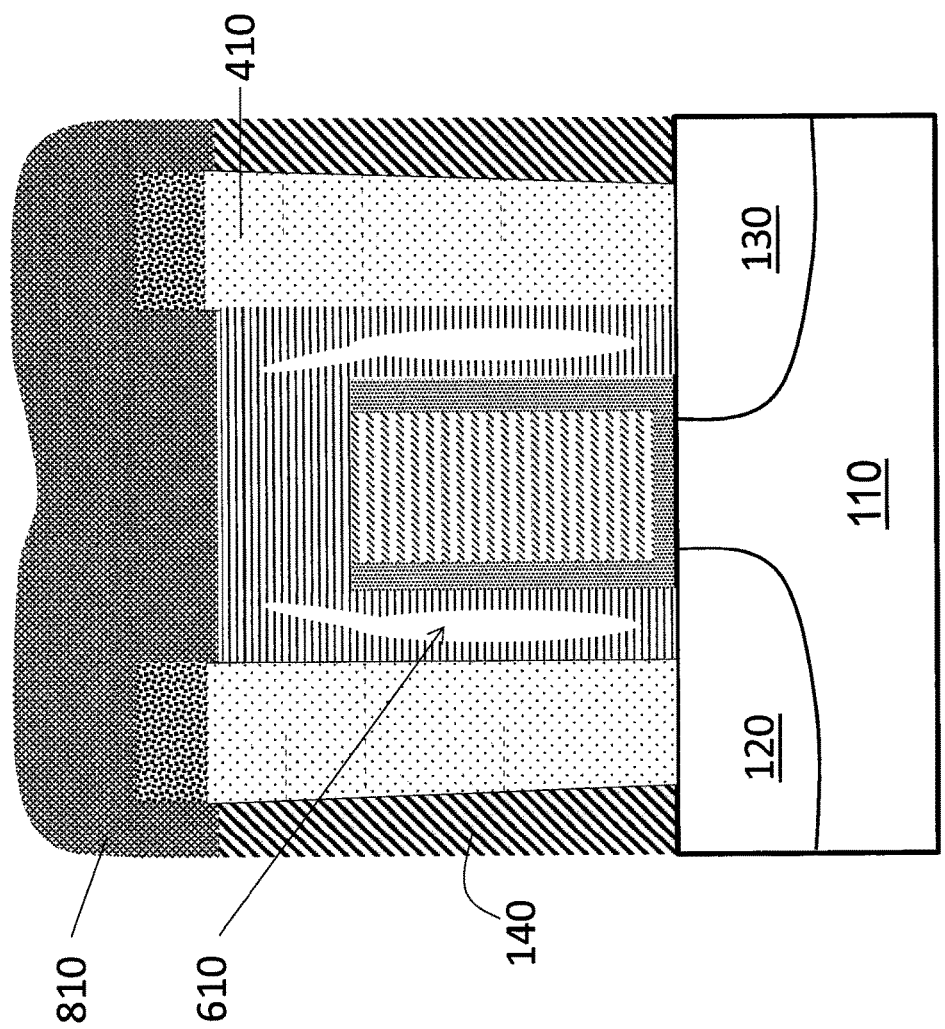

FIG. 8 shows an additional gate cap 810 that is deposited on the structure shown in FIG. 7. The additional gate cap 810 can be any suitable dielectric material such as silicon oxygen carbon (SiOC). The gate cap 810 can be deposited by any suitable deposition technique such as CVD or ALD, for example. In one or more embodiments, the gate cap 810 is deposited by a conformal deposition process. The additional gate cap 810 completely fills the gap 715 between the selective metal caps 710.

Figure 9:
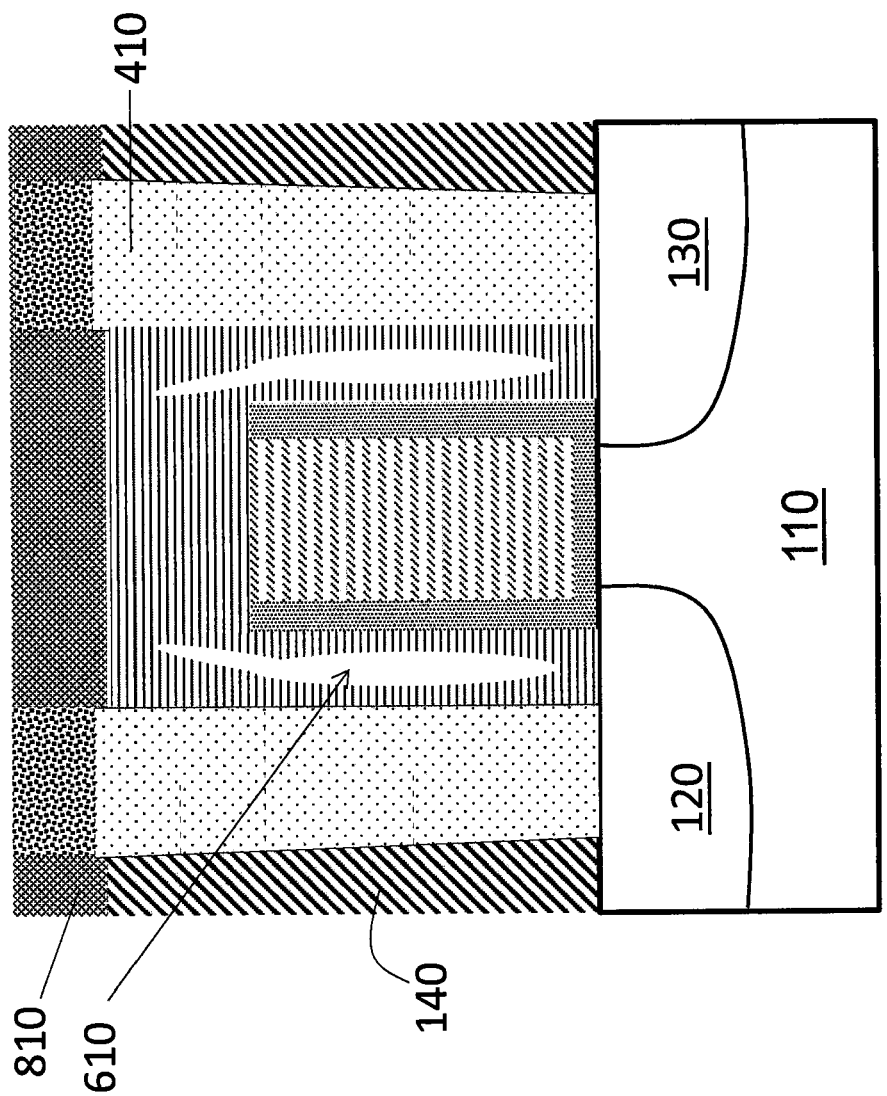
Figure 10:
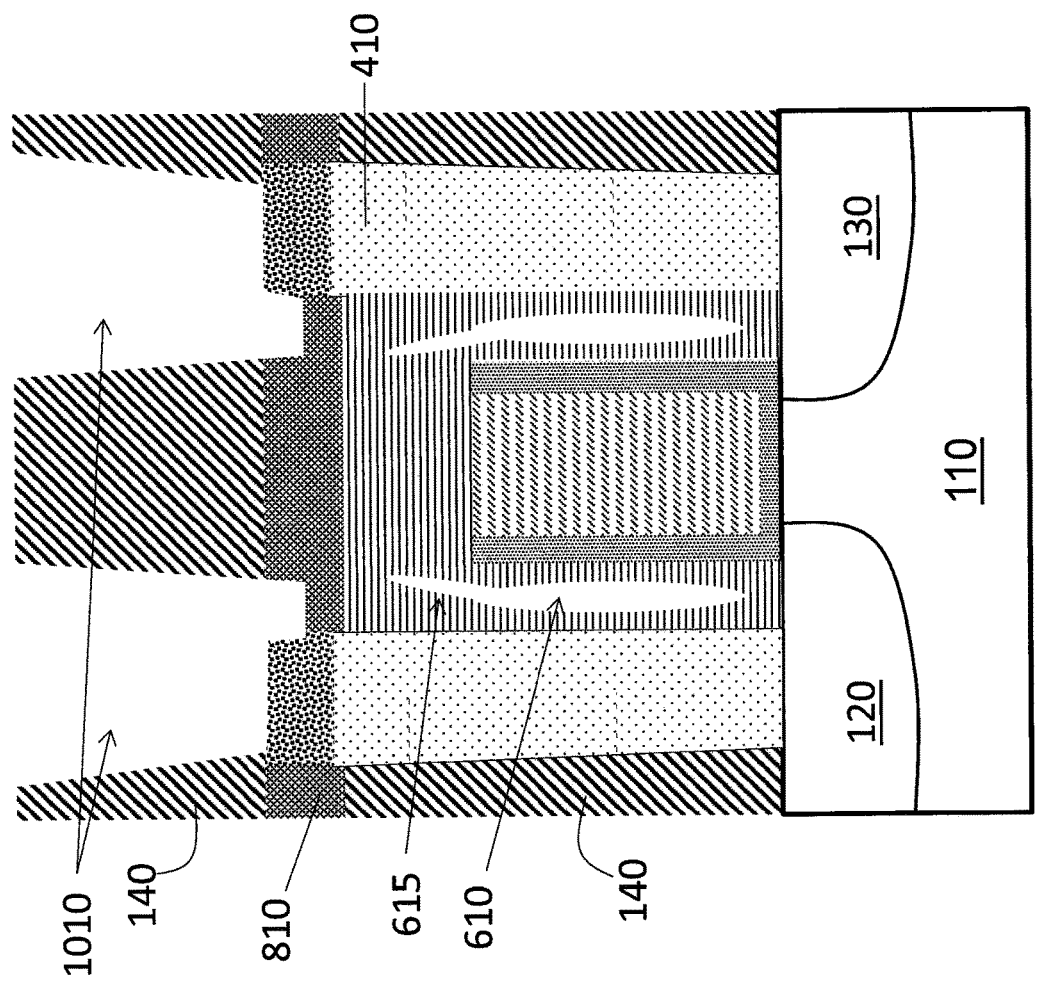

FIG. 9 shows the result of planarizing the additional gate cap 810. The planarized additional gate cap 810 has no seams or voids. FIG. 10 shows the result of patterning trenches 1010 for higher-level contacts 1110 above the selective metal caps 710. The processes involved in forming the trenches 1010 are known and not fully detailed herein. A second ILD 140 is deposited on the additional gate cap 810 and the selective metal caps 710. This second ILD 140 is then patterned to form the trenches 1010. The void-free additional gate cap 810 forms an additional layer that prevents contact between the trenches 1010 and the seams 615. This is because, even despite an over-etch of the additional gate cap 810, some of the additional gate cap 810 remains between portions of trenches 1010 that are not directly above the selective metals caps 710 and the non-conformal dielectric 610 within which the seam 615 is formed.

Figure 11:
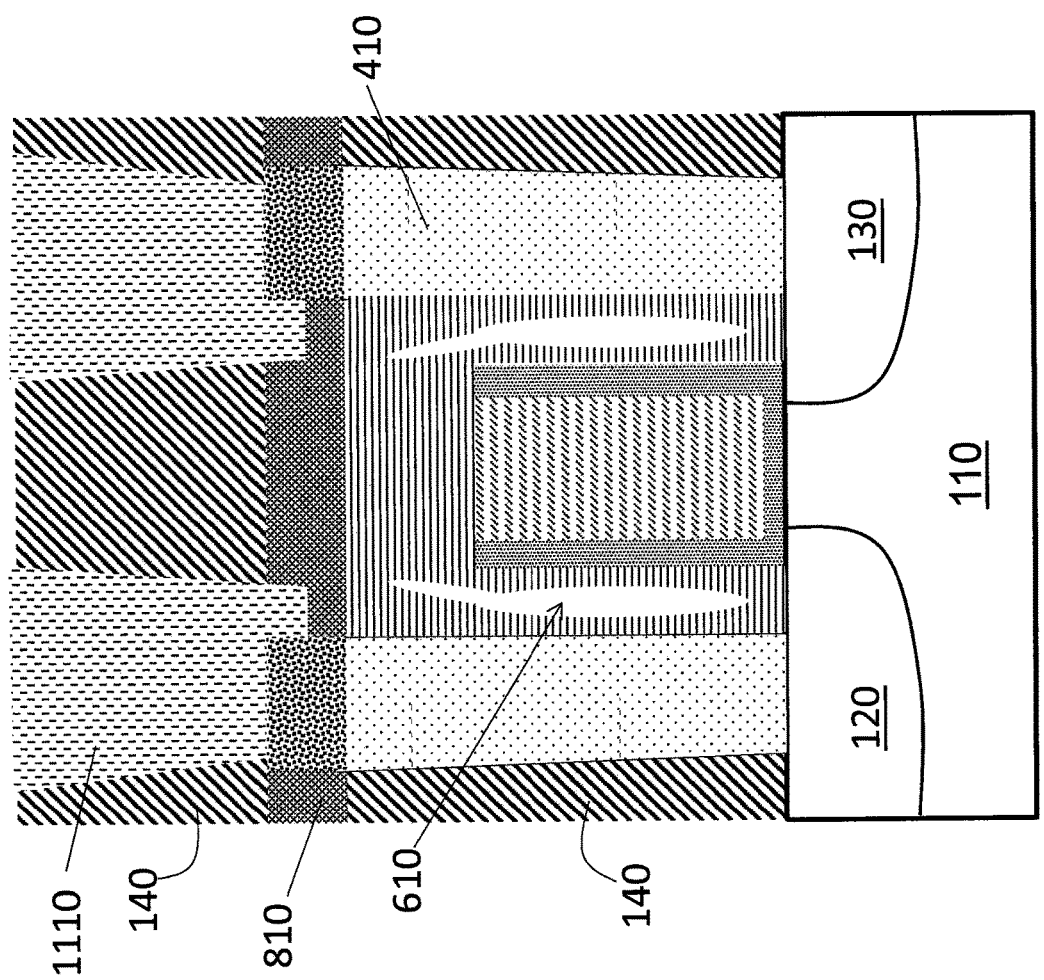

FIG. 11 shows the higher-level contacts 1110 that are formed by depositing metal into the trenches 1010 and performing a planarization process. As FIG. 11 indicates, the metal in the higher-level contacts 1110 is in contact with either a selective metal cap 710 or the additional gate cap 810 at the bottom. No portion of the higher-level contacts 1110 is in contact with the non-conformal dielectric 610 within which the seam 615 is formed. As a result of using the additional gate cap 810, the seams 615 are not compromised during formation of the self-aligned higher-level contacts 1110, and metal that fills the trenches 1010 does not enter the seam 615. Higher-level contacts 1110 can include any suitable conducting material such as metals or conducting metallic compounds, for example. In one or more embodiments, each higher-level contact 1110 can include a liner (e.g., titanium nitride) on the trench sidewalls and the rest of contact trench is filled with a metal such as tungsten, cobalt, or copper.

Various embodiments are described herein with reference to the related drawings. Alternative embodiments can be devised without departing from the scope of the described embodiments. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The terminology used herein is for the purpose of describing particular embodiments only and is not intended to be limiting of the invention. As used herein, the singular forms "a", "an" and "the" are intended to include the plural forms as well, unless the context clearly indicates otherwise.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor transistor, comprising:
   a source region and a drain region formed within a substrate;
   a gate formed above the substrate;
   a source contact formed above the source region and a drain contact formed above the drain region;
   air spacers formed within a dielectric between the gate and each of the source contact and the drain contact;
   metal caps formed on the source contact and the drain contact; and
   a gate cap between the dielectric and at least a portion of a bottom surface of higher-level contacts, which are contacts formed above the source contact and the drain contact, wherein the gate cap contacts the dielectric on a first side of the gate cap and the gate cap contacts the portion of the bottom surface of the higher-level contacts on a second side of the gate cap that is opposite the first side of the gate cap.

2. The transistor according to claim 1, wherein the gate cap is silicon oxygen carbon (SiOC).

3. The transistor according to claim 1, wherein the dielectric is a non-conformal dielectric.

4. The transistor according to claim 1, wherein the air spacers include a seam portion that extends within the dielectric above the gate.

5. The transistor according to claim 1, wherein the bottom surface of the higher-level contacts is in contact with either the metal caps or portions of the gate cap.

6. The transistor according to claim 5, wherein the portions of the gate cap are thinner than other portions of the gate cap.

7. The transistor according to claim 1, further comprising a gate dielectric formed as a liner to the gate.

8. The transistor according to claim 7, wherein the gate dielectric is silicon oxide, silicon nitride, silicon oxynitride, boron nitride, high-k materials, or any combination thereof.

9. The transistor according to claim 8, wherein the high-k materials are metal oxides including hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobate.

10. The transistor according to claim 8, wherein the high-k materials include lanthanum.

11. The transistor according to claim 8, wherein the high-k materials include aluminum.

12. The transistor according to claim 1, further comprising an inter-layer dielectric (ILD) adjacent to the source contact and the drain contact on a side opposite a side closest to the gate.

13. The transistor according to claim 12, wherein the higher-level contacts are separated by the ILD.

14. The transistor according to claim 13, wherein the gate cap is formed above the ILD adjacent to the source contact and the drain contact.

15. The transistor according to claim 12, wherein the ILD is silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any combination thereof.

* * * * *